United States Patent
Hirano

(10) Patent No.: US 10,155,185 B2
(45) Date of Patent: Dec. 18, 2018

(54) POLYIMIDE-BASED RESIN FILM CLEANING LIQUID, METHOD FOR CLEANING POLYIMIDE-BASED RESIN FILM, METHOD FOR PRODUCING POLYIMIDE COATING, METHOD FOR PRODUCING FILTER, FILTER MEDIUM, OR FILTER DEVICE, AND METHOD FOR PRODUCING CHEMICAL SOLUTION FOR LITHOGRAPHY

(71) Applicant: Tokyo Ohka Kogyo Co., Ltd., Kanagawa (JP)

(72) Inventor: Isao Hirano, Kanagawa (JP)

(73) Assignee: TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 15/585,362

(22) Filed: May 3, 2017

(65) Prior Publication Data
US 2017/0321168 A1    Nov. 9, 2017

(30) Foreign Application Priority Data

May 9, 2016 (JP) .................. 2016-093808
Aug. 3, 2016 (JP) .................. 2016-152682

(51) Int. Cl.
| | | |
|---|---|---|
| C08G 73/10 | (2006.01) | |
| B01D 39/00 | (2006.01) | |
| C11D 7/50 | (2006.01) | |
| C11D 11/00 | (2006.01) | |
| G03F 7/16 | (2006.01) | |
| G03F 7/30 | (2006.01) | |
| G03F 7/40 | (2006.01) | |
| C11D 7/26 | (2006.01) | |
| C11D 7/32 | (2006.01) | |
| C11D 7/34 | (2006.01) | |

(52) U.S. Cl.
CPC ............ *B01D 39/00* (2013.01); *C11D 7/50* (2013.01); *C11D 11/0041* (2013.01); *G03F 7/16* (2013.01); *G03F 7/30* (2013.01); *G03F 7/40* (2013.01); *C11D 7/263* (2013.01); *C11D 7/264* (2013.01); *C11D 7/266* (2013.01); *C11D 7/3263* (2013.01); *C11D 7/3272* (2013.01); *C11D 7/3281* (2013.01); *C11D 7/34* (2013.01)

(58) Field of Classification Search
CPC ............ C08G 73/1007; C08G 73/1042; C11D 11/0047
USPC ........................................ 510/175; 430/192
See application file for complete search history.

(56) References Cited

U.S. PATENT DOCUMENTS

| | | | |
|---|---|---|---|
| 2009/0186295 A1* | 7/2009 | Win ............... | C08G 73/106 430/270.1 |
| 2016/0222165 A1* | 8/2016 | Wakita ............. | G02B 5/20 |
| 2018/0028983 A1* | 2/2018 | Takashima ........ | B01D 71/64 |

FOREIGN PATENT DOCUMENTS

JP    5605566    10/2014

* cited by examiner

*Primary Examiner* — Gregory E Webb
(74) *Attorney, Agent, or Firm* — Wenderoth, Lind & Ponack, L.L.P.

(57) ABSTRACT

A polyimide-based resin film cleaning liquid includes at least one solvent selected from the group consisting of a hydroxy aliphatic carboxylic acid ester, an aliphatic carboxylic acid ester, a chain or cyclic ketone, an alkylene glycol monoalkyl ether, an alkylene glycol monoalkyl ether acetate, and an aprotic polar solvent other than these solvents.

12 Claims, No Drawings

POLYIMIDE-BASED RESIN FILM CLEANING LIQUID, METHOD FOR CLEANING POLYIMIDE-BASED RESIN FILM, METHOD FOR PRODUCING POLYIMIDE COATING, METHOD FOR PRODUCING FILTER, FILTER MEDIUM, OR FILTER DEVICE, AND METHOD FOR PRODUCING CHEMICAL SOLUTION FOR LITHOGRAPHY

CROSS-REFERENCE TO RELATED APPLICATIONS

Priority is claimed on Japanese Patent Application No. 2016-093808 filed May 9, 2016 and Japanese Patent Application No. 2016-152682 filed Aug. 3, 2016, the content of which is incorporated herein by reference.

BACKGROUND OF THE INVENTION

Field of the Invention

The present invention relates to a polyimide-based resin film cleaning liquid, a method for cleaning a polyimide-based resin film, a method for producing a polyimide coating, a method for producing a filter including the polyimide coating, a method for producing a filter medium or a filter device provided with the filter, and a method for producing a chemical solution for lithography.

Background Art

Conventionally, various porous films have been used for applications such as filters.

For example, as a porous film of polyimide, there is known a porous film obtained by coating a varnish in which silica particles are dispersed in a solution of polyamic acid or polyimide on a substrate, then heating the coated film as necessary to obtain a polyimide coating which includes silica particles, and subsequently eluting and removing the silica particles in the polyimide coating with hydrogen fluoride water (refer to Japanese Patent No. 5605566).

SUMMARY OF THE INVENTION

The present inventors found that, when a liquid separation filter assembled using a polyimide coating (for example, a porous polyimide coating) is flushed with various organic solvents (a mixed solvent of propylene glycol monomethyl ether and propylene glycol monomethyl ether acetate, butyl acetate, isopropyl alcohol, or the like), there is a problem in that elution of polyimide corresponding to the low molecular weight portion of the polymer from the polyimide coating is observed in some cases. To apply the polyimide coating as a filter, it is required to reduce the eluates (for example, the low molecular weight portion of the polymer of the polyimide) from the polyimide coating.

The present invention has been made in view of the circumstances described above, and an object of the present invention is to provide a polyimide-based resin film cleaning liquid which is excellent, for example, in reducing the low molecular weight portion of the polyimide polymer or the like remaining on the surface of the polyimide-based resin film or in the film, a method for cleaning a polyimide-based resin film, for example, a method for producing a polyimide coating in which a low molecular weight portion of a polyimide polymer or the like is reduced, a method for producing a filter including the polyimide coating, a method for producing a filter medium or a filter device each having the filter provided with, and a method for producing a chemical solution for lithography.

The present inventors found that it is possible to solve the problem described above by using a specific solvent as a polyimide-based resin film cleaning liquid to elute and reduce, for example, a low molecular weight portion or the like of a polymer of a polyimide resin remaining on the surface of the polyimide-based resin film or in the film, thereby completing the present invention.

Specifically, the present invention is as follows.

According to a first aspect of the present invention, there is provided a polyimide-based resin film cleaning liquid including at least one solvent selected from the group consisting of a hydroxy aliphatic carboxylic acid ester, an aliphatic carboxylic acid ester, a chain or cyclic ketone, an alkylene glycol monoalkyl ether, an alkylene glycol monoalkyl ether acetate, and an aprotic polar solvent other than these solvents.

According to a second aspect of the present invention, there is provided a method for cleaning a polyimide-based resin film containing a resin formed of polyamic acid and/or polyimide, the method including bringing the polyimide-based resin film into contact with the polyimide-based resin film cleaning liquid of the first aspect.

According to a third aspect of the present invention, there is provided a method for producing a polyimide coating, the method including a cleaning step according to the method for cleaning a polyimide-based resin film of the second aspect.

According to a fourth aspect of the present invention, there is provided a method for producing a filter including a polyimide coating, in which the polyimide coating is produced according to the method for producing a polyimide coating of the third aspect.

According to a fifth aspect of the present invention, there is provided a method for producing a filter medium provided with a filter including a polyimide coating, in which the polyimide coating is produced according to the method for producing a polyimide coating of the third aspect.

According to a sixth aspect of the present invention, there is provided a method for producing a filter device provided with a filter including a polyimide coating, in which the polyimide coating is produced according to the method for producing a polyimide coating of the third aspect.

According to a seventh aspect of the present invention, there is provided a method for producing a chemical solution for lithography, the method including passing the polyimide-based resin film cleaning liquid of the first aspect through a filter device provided with a filter including a polyimide coating, and then passing a chemical solution for lithography for treatment through the filter device.

The polyimide-based resin film cleaning liquid according to the first aspect of the present invention is excellent in reducing, for example, a low molecular weight portion or the like of the polyimide polymer remaining on the surface of the polyimide-based resin film or in the film.

The method for cleaning the polyimide-based resin film according to the second aspect of the present invention is excellent in reducing, for example, the amount of the low molecular weight portion or the like of the polyimide polymer remaining on the surface of the polyimide-based resin film or in the film.

According to the present invention, it is possible to provide, for example, a method for producing a polyimide coating in which the amount of a low molecular weight portion or the like of a polyimide polymer is reduced, a method for producing a filter including the polyimide coating, a method for producing a filter medium or a filter device provided with the filter, and a method for producing a chemical solution for lithography.

DETAILED DESCRIPTION OF THE INVENTION

Detailed description will be given below of embodiments of the present invention, but the present invention is not limited at all to the following embodiments and it is possible to add appropriate modifications within the scope of the object of the present invention.

In the present invention, the polyimide-based resin film means a film containing a resin formed of polyamic acid and/or polyimide.

In addition, in the present specification, for example, description of "P and/or Q" or the like as "polyamic acid and/or polyimide" or the like means "at least one selected from the group consisting of P and Q". Here, P and Q are arbitrary terms.

In the present invention, the term "cleaning" does not mean removing the polyimide-based resin film itself (the entire film), but means eluting and reducing a residue or the like present on the surface of the polyimide-based resin film or in the film (for example, a low molecular weight portion or the like of the polyimide polymer).

In addition, in the present invention, the "low molecular weight portion of a polyimide polymer" of which the content is reduced by the polyimide-based resin film cleaning liquid means the low molecular weight portion of the polyimide and/or the low molecular weight portion of the polyamic acid. For example, in the method for producing a polyimide coating described below, in a case where the cleaning method according to the second aspect is performed after obtaining an unbaked composite film with a varnish using a resin formed of polyamic acid, the "low molecular weight portion of a polyimide polymer" of which the content is reduced by the polyimide-based resin film cleaning liquid is mainly the low molecular weight portion of the polyamic acid. In a case of performing the cleaning method according to the second aspect after baking the same unbaked composite film, the "low molecular weight portion of a polyimide polymer" reduced by the polyimide-based resin film cleaning liquid is considered to be the low molecular weight portion of polyimide or the low molecular weight portion of polyimide and the low molecular weight portion of polyamic acid.

Polyimide-Based Resin Film Cleaning Liquid

First, description will be given of the polyimide-based resin film cleaning liquid according to the first aspect of the present invention.

The polyimide-based resin film cleaning liquid according to the first aspect includes at least one solvent selected from the group consisting of a hydroxy aliphatic carboxylic acid ester, an aliphatic carboxylic acid ester a chain or cyclic ketone, an alkylene glycol monoalkyl ether, an alkylene glycol monoalkyl ether acetate, and an aprotic polar solvent other than these solvents. The "an aprotic polar solvent other than these solvents" are the same as the following "an aprotic polar solvent (A) other than the solvent (B) described below".

The polyimide-based resin film cleaning liquid according to the first aspect preferably includes (A) an aprotic polar solvent other than the solvent (B) described below and (B) at least one solvent selected from the group consisting of a hydroxy aliphatic carboxylic acid ester, an aliphatic carboxylic acid ester, a chain or cyclic ketone, an alkylene glycol monoalkyl ether, and an alkylene glycol monoalkyl ether acetate (in the present specification, also referred to as "solvent (B)").

Aprotic Polar Solvent (A)

It is preferable that the aprotic polar solvent described above be at least one selected from the group consisting of a solvent having an amide structure represented by the following general formula (s) and an alkylsulfinyl alkane (also known as dialkylsulfoxide).

One aprotic polar solvent may be used singly or two or more thereof may be used in combination.

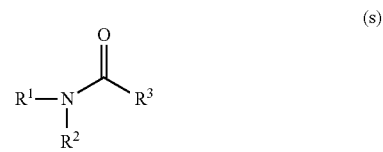

In the formula, $R^1$ and $R^2$, which may be the same or different, each represents a hydrogen atom or an alkyl group; $R^3$ represents a hydrogen atom, an alkyl group, or a group represented by —$NR^4R^5$ where $R^4$ and $R^5$, which may be the same or different, represent a hydrogen atom or an alkyl group; and $R^2$ and $R^3$ may be combined with each other to form a ring.

The alkyl group represented by $R^1$ to $R^5$ is preferably an alkyl group having 1 to 3 carbon atoms.

The group formed by combining $R^2$ and $R^3$ to form a ring is preferably an alkylene group having 1 to 3 carbon atoms, and more preferably an alkylene group having 1 or 2 carbon atoms. Examples of the ring to be formed include a 2-imidazolidone ring, a 2-pyrrolidone ring, a 3,4,5,6-tetrahydro-2(1H)-pyrimidinone ring, and the like.

Examples of the solvent having an amide structure represented by general formula (s) described above include 1,1,3,3-tetramethylurea, 1,1,3,3-tetraethylurea, dimethylformamide, diethylformamide, dimethylacetamide, 1,3-dimethyl-2-imidazolidone, N-methylpyrrolidone, 1,3-dimethyl-3,4,5,6-tetrahydro-2(1H)-pyrimidinone, N,N-dimethylpropionamide, N-methylacetamide, N-methylformamide, and the like.

Examples of the alkylsulfinyl alkane (also known as dialkylsulfoxide) include dimethylsulfoxide, methylethylsulfoxide, and the like.

More preferably, the aprotic polar solvent is at least one selected from the group consisting of dimethylformamide, dimethylacetamide, N-methylpyrrolidone, 1,1,3,3-tetramethylurea, and dimethylsulfoxide.

Solvent (B)

The solvent (B) is at least one solvent selected from the group consisting of a hydroxy aliphatic carboxylic acid ester, an aliphatic carboxylic acid ester, a chain or cyclic ketone, an alkylene glycol monoalkyl ether, and an alkylene glycol monoalkyl ether acetate.

In the present specification, an aliphatic carboxylic acid esters does not encompass a hydroxy aliphatic carboxylic acid ester.

Examples of the hydroxy aliphatic carboxylic acid ester include methyl lactate, ethyl lactate, and the like.

Examples of aliphatic carboxylic acid esters include n-butyl acetate, iso-butyl acetate, n-propyl acetate, and the like.

Examples of the chain or cyclic ketone include 2-heptanone (also known as methyl amyl ketone), cyclohexanone, and the like.

Examples of the alkylene glycol monoalkyl ether include propylene glycol monoalkyl ether, butylene glycol monoalkyl ether, pentane glycol monoalkyl ether, and the like, with propylene glycol monomethyl ether being preferable.

Examples of the alkylene glycol monoalkyl ether acetate include propylene glycol monoalkyl ether acetate, butylene glycol monoalkyl ether acetate, pentane glycol monoalkyl ether acetate, and the like, with propylene glycol monomethyl ether acetate being preferable.

The solvent (B) is preferably a compound having 4 to 7 carbon atoms, and more preferably a compound having 5 to 7 carbon atoms.

The solvent (B) is preferably at least one selected from the group consisting of ethyl lactate, butyl acetate, 2-heptanone, cyclohexanone, and propylene glycol monomethyl ether acetate.

The aprotic polar solvent (A) may be used alone, or the solvent (B) may be used alone.

In a case of using the aprotic polar solvent (A) and the solvent (B) in a mixture, the mixing ratio is not particularly limited, but the content ratio of the above solvent (B) with respect to the total of the above aprotic polar solvent (A) and the above solvent (B) [B/(A+B)] is preferably 80 mass % or less, more preferably 70 mass % or less, even more preferably 50 mass % or less, and particularly preferably 40 mass % or less.

The content ratio [B/(A+B)] of the solvent (B) is preferably 10 mass % or more, more preferably 20 mass % or more, and even more preferably 30 mass % or more.

Method for Cleaning Polyimide-Based Resin Film

The method for cleaning the polyimide-based resin film according to the second aspect cleans the polyimide-based resin film by bringing the polyimide-based resin film cleaning liquid of the first aspect into contact with the polyimide-based resin film containing a resin formed of polyamic acid and/or polyimide.

Examples of cleaning methods include a method in which the polyimide-based resin film is immersed in the polyimide-based resin film cleaning liquid of the first aspect at room temperature (for example, 23° C.) or under appropriate heating and then taken out once or a plurality of times (for example, three times) repeatedly, a method of repeating shower cleaning once or a plurality of times (for example, three times), or the like. Furthermore, in order to dry the cleaned polyimide-based resin film, it is possible to apply known methods without limitation such as air drying the cleaned polyimide-based resin film at room temperature, warming the cleaned polyimide-based resin film to a proper set temperature in a constant temperature bath, vacuum drying the cleaned polyimide-based resin film, and the like. For example, it is also possible to adopt a method for fixing the end portion of the polyimide-based resin film to a mold formed of SUS or the like and preventing deformation.

Even in a case where an additive is included in the housing material or the like forming the filter device, bringing the polyimide-based resin film cleaning liquid of the first aspect into contact with the entirety of the filter device having a filter medium formed of a polyimide-based resin film by allowing the solution to flow therethrough, immersing the device in the solution, or the like makes it possible to reduce the elution amount of the additive in the subsequent steps.

It is possible to set the non-volatile content (low molecular weight substances and the like) remaining in a polyimide-based resin film after concentrating, heating, and drying the n-butyl acetate in which the polyimide-based resin film cleaned by the method for cleaning the polyimide-based resin film described in Examples described below was immersed for 24 hours to 1.0 mg/300 $cm^2$ or less, preferably, it is possible to set the non-volatile content in a polyimide-based resin film to 0.8 mg/300 $cm^2$ or less, more preferably, it is possible to set the non-volatile content in a polyimide-based resin film to 0.6 mg/300 $cm^2$ or less, and even more preferably, it is possible to set the non-volatile content in a polyimide-based resin film to 0.5 mg/300 $cm^2$ or less.

Polyamic Acid

A method for cleaning the polyimide-based resin film according to the second aspect is a method for cleaning a polyimide-based resin film containing a resin formed of polyamic acid and/or polyimide.

For the polyamic acid described above, it is possible to use a polyamic acid obtained by polymerizing an arbitrary tetracarboxylic dianhydride and diamine without particular limitation. The usage amount of the tetracarboxylic dianhydride and the diamine is not particularly limited, but using 0.50 to 1.50 mol of diamine with respect to 1 mol of the tetracarboxylic dianhydride is preferable, using 0.60 to 1.30 mol of diamine is more preferable, and using 0.70 to 1.20 mol of diamine is particularly preferable.

It is possible to appropriately select the tetracarboxylic dianhydride from tetracarboxylic dianhydrides conventionally used as a raw material for synthesis of polyamic acid. The tetracarboxylic dianhydride may be an aromatic tetracarboxylic dianhydride or an aliphatic tetracarboxylic dianhydride, but from the viewpoint of the heat resistance of the obtained polyimide resin, it is preferable to use the aromatic tetracarboxylic dianhydride. Two or more types of tetracarboxylic dianhydrides may be used in combination.

Preferable specific examples of the aromatic tetracarboxylic dianhydride include pyromellitic acid dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 3,3',4,4'-biphenyltetracarboxylic dianhydride, 2,3,3',4'-biphenyltetracarboxylic dianhydride, 2,2,6,6-biphenyltetracarboxylic dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 3,3',4,4'-benzophenonetetracarboxylic dianhydride, bis(3,4-dicarboxyphenyl)ether dianhydride, bis(2,3-dicarboxyphenyl)ether dianhydride, 2,2',3,3'-benzophenonetetracarboxylic dianhydride, 4,4-(p-phenylenedioxy)diphthalic dianhydride, 4,4-(m-phenylenedioxy)diphthalic dianhydride, 1,2,5,6-naphthalene tetracarboxylic dianhydride, 1,4,5,8-naphthalenetetracarboxylic dianhydride, 2,3,6,7-naphthalenetetracarboxylic dianhydride, 1,2,3,4-benzenetetracarboxylic dianhydride, 3,4,9,10-perylene tetracarboxylic dianhydride, 2,3,6,7-anthracene tetracarboxylic dianhydride, 1,2,7,8-phenanthrene tetracarboxylic dianhydride, 9,9-bis fluorene phthalic anhydride, 3,3',4,4'-diphenylsulfone tetracarboxylic dianhydride, and the like. Examples of the aliphatic tetracarboxylic dianhydride include ethylene tetracarboxylic dianhydride, butane tetracarboxylic dianhydride, cyclopentane tetracarboxylic dianhydride, cyclohexane tetracarboxylic dianhydride, 1,2,4,5-cyclohexane tetracarboxylic dianhydride, 1,2,3,4-cyclohexane tetracarboxylic dianhydride, and the like. Among these, 3,3',4,4'-biphenyltetracarboxylic dianhydride and pyromellitic acid dianhydride are preferable from the viewpoints of price, availability, and the like. In addition, it is also possible to use these tetracarboxylic dianhydrides alone or in a combination of two or more types.

It is possible to appropriately select the diamine from diamines conventionally used as raw materials for synthesis of polyamic acid. The diamines may be either an aromatic diamine or an aliphatic diamine, but from the viewpoint of heat resistance of the obtained polyimide resin, an aromatic diamine is preferable. Two or more types of these diamines may be used in combination.

Examples of aromatic diamines include a diamino compound in which one phenyl group or approximately 2 to 10 phenyl groups are bonded. Specific examples thereof include phenylenediamine and derivatives thereof, diaminobiphenyl compounds and derivatives thereof, diaminodiphenyl compounds and derivatives thereof, diaminotriphenyl compounds and derivatives thereof, diaminonaphthalene and derivatives thereof, aminophenylaminoindane and derivatives thereof, diaminotetraphenyl compounds and derivatives thereof, diaminohexaphenyl compounds and derivatives thereof, and cardo-type fluorenediamine derivatives.

The phenylenediamine is a m-phenylenediamine, a p-phenylenediamine, or the like and examples of phenylenediamine derivatives include diamines in which alkyl groups such as methyl group and ethyl group are bonded, for example, 2,4-diaminotoluene, 2,4-triphenylene diamine, and the like.

The diaminobiphenyl compound is a compound in which two aminophenyl groups are bonded to each other through phenyl groups. For example, the diaminobiphenyl compound is 4,4'-diaminobiphenyl, 4,4'-diamino-2,2'-bis(trifluoromethyl)biphenyl, and the like.

A diaminodiphenyl compound is a compound in which two phenyl groups of two aminophenyl groups are bonded through a group. Examples of the bond formed by the group include an ether bond, a sulfonyl bond, a thioether bond, a bond formed by an alkylene or a derivative group thereof, an imino bond, an azo bond, a phosphine oxide bond, an amide bond, a ureylene bond, or the like. The alkylene bond has approximately 1 to 6 carbon atoms and a derivative groups thereof have one or more of halogen atoms and the like which at least one hydrogen atom of the alkylene group is substituted with.

Examples of the diaminodiphenyl compound include 3,3'-diaminodiphenyl ether, 3,4'-diaminodiphenyl ether, 4,4'-diaminodiphenyl ether, 3,3'-diaminodiphenyl sulfone, 3,4'-diaminodiphenyl sulfone, 4,4'-diaminodiphenyl sulfone, 3,3'-diaminodiphenylmethane, 3,4'-diaminodiphenylmethane, 4,4'-diaminodiphenylmethane, 4,4'-diaminodiphenyl sulfide, 3,3'-diaminodiphenyl ketone, 3,4-diaminodiphenyl ketone, 2,2-bis(p-aminophenyl)propane, 2,2'-bis(p-aminophenyl)hexafluoropropane, 4-methyl-2,4-bis(p-aminophenyl)-1-pentene, 4-methyl-2,4-bis(p-aminophenyl)-2-pentene, iminodianiline, 4-methyl-2,4-bis(p-aminophenyl)pentane, bis(p-aminophenyl)phosphine oxide, 4,4'-diaminoazobenzene, 4,4'-diaminodiphenylurea, 4,4'-diaminodiphenylamide, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(4-aminophenoxy)phenyl]hexafluoropropane, and the like.

Among these, p-phenylenediamine, m-phenylenediamine, 2,4-diaminotoluene, and 4,4'-diaminodiphenyl ether are preferable from the viewpoints of price, availability, and the like.

The diaminotriphenyl compound is a compound in which two aminophenyl groups and one phenylene group are all bonded via a group to form a bond and the group is selected from the same groups as those for the diaminodiphenyl compound. Examples of diaminotriphenyl compounds include 1,3-bis(m-aminophenoxy)benzene, 1,3-bis(p-aminophenoxy)benzene, 1,4-bis(p-aminophenoxy)benzene, and the like.

Examples of the diaminonaphthalene include 1,5-diaminonaphthalene and 2,6-diaminonaphthalene.

Examples of the aminophenylaminoindane include 5 or 6-amino-1-(p-aminophenyl)-1,3,3-trimethylindane.

Examples of the diaminotetraphenyl compound include 4,4'-bis(p-aminophenoxy)biphenyl, 2,2'-bis[p-(p'-aminophenoxy)phenyl]propane, 2,2'-bis[p-(p'-aminophenoxy)biphenyl]propane, 2,2'-bis[p-(m-aminophenoxy)phenyl]benzophenone, and the like.

Examples of the cardo-type fluorenediamine derivative include 9,9-bisaniline fluorene, and the like.

Examples of the aliphatic diamine include diamines having approximately 2 to 15 carbon atoms, and specific examples thereof include pentamethylenediamine, hexamethylenediamine, heptamethylenediamine, and the like.

Here, the diamine may be a compound in which the hydrogen atom is substituted with at least one substituent selected from the group consisting of a halogen atom, a methyl group, a methoxy group, a cyano group, a phenyl group, and the like.

The means for producing the polyamic acid is not particularly limited, and examples thereof include known methods such as a method for reacting an acid and a diamine component in a solvent.

The reaction of the tetracarboxylic dianhydride with the diamine is usually performed in a solvent. The solvent used for the reaction between the tetracarboxylic dianhydride and the diamine is not particularly limited as long as the solvent is able to dissolve the tetracarboxylic dianhydride and the diamine and does not react with the tetracarboxylic dianhydride and the diamine. Solvents may be used alone or in a mixture of two or more types.

Examples of the solvent used for the reaction between the tetracarboxylic dianhydride and the diamine include nitrogen-containing polar solvents such as N-methyl-2-pyrrolidone, N,N-dimethylacetamide, N,N-diethylacetamide, N,N-dimethylformamide, N,N-diethylformamide, N-methylcaprolactam, and N,N,N',N'-tetramethylurea; lactone-based polar solvents such as β-propiolactone, γ-butyrolactone, γ-valerolactone, δ-valerolactone, γ-caprolactone, and ε-caprolactone; dimethylsulfoxide; acetonitrile; fatty acid esters such as ethyl lactate and butyl lactate; ethers such as diethylene glycol dimethyl ether, diethylene glycol diethyl ether, dioxane, tetrahydrofuran, methyl cellosolve acetate, and ethyl cellosolve acetate; and phenolic solvents such as cresols. It is possible to use these solvents alone or in a combination of two or more types. The amount of the solvent to be used is not particularly limited, but it is desirable that the content of the polyamic acid to be produced be from 5 to 50 mass %.

Among these solvents, due to the solubility of the obtained polyamic acid, nitrogen-containing polar solvents such as N-methyl-2-pyrrolidone, N,N-dimethylacetamide, N,N-diethylacetamide, N,N-dimethylformamide, N,N-diethyl formamide, N-methylcaprolactam, and N,N,N',N'-tetramethylurea are preferable.

The polymerization temperature is generally −10 to 120° C., and preferably 5 to 30° C. The polymerization time varies depending on the raw material composition to be used, but is usually 3 to 24 hours.

The polyamic acid may be used alone or in a combination of two or more types.

Polyimide

As long as the polyimide described above is a soluble polyimide which is able to dissolve in a solvent used for a varnish which may be used in the third aspect to be described below, the structure and molecular weight thereof are not limited and it is possible to use known polyimides. The polyimide may have a functional group capable of condensing such as a carboxy group or the like in the side chain or a functional group promoting a cross-linking reaction or the like during baking.

In order to obtain a solvent-soluble polyimide, use of a monomer for introducing a flexible bending structure in the main chain is effective, for example, aliphatic diamines such as ethylenediamine, hexamethylenediamine, 1,4-diaminocyclohexane, 1,3-diaminocyclohexane, and 4,4'-diaminodicyclohexylmethane; aromatic diamines such as 2-methyl-1,4-phenylenediamine, o-tolidine, m-tolidine, 3,3'-dimethoxybenzidine, and 4,4'-diaminobenzanilide; polyoxyalkylene diamines such as polyoxyethylene diamine, polyoxypropylene diamine, and polyoxybutylene diamine; polysiloxane diamines; 2,3,3',4'-oxydiphthalic anhydride, 3,4,3',4'-oxydiphthalic anhydride, 2,2-bis(4-hydroxyphenyl)propane dibenzoate-3,3',4,4'-tetracarboxylic dianhydride, and the like. In addition, use of a monomer having a functional group capable of improving solubility in a solvent, for example, the use of fluorinated diamines such as 2,2'-bis(trifluoromethyl)-4,4'-diaminobiphenyl and 2-trifluoromethyl-1,4-phenylenediamine is also effective. Furthermore, in addition to the monomers for improving the solubility of the polyimide, it is also possible to use the same monomers as those described in the section of the polyamic acid in combination as long as the solubility is not impaired.

The means for producing the polyimide soluble in a solvent is not particularly limited and, for example, it is possible to use a known method such as a method in which polyamic acid is chemically imidized or heat-imidized and dissolved in a solvent. Examples of such polyimides include aliphatic polyimides, (completely aliphatic polyimide), aromatic polyimides, and the like, and aromatic polyimides are preferable. As the aromatic polyimide, aromatic polyimides obtained by a thermal or chemical cyclization reaction of a polyamic acid having a repeating unit represented by the formula (1) or aromatic polyimides obtained by dissolving a polyimide having a repeating unit represented by the formula (2) in a solvent may be used. In the formula, Ar represents an aryl group.

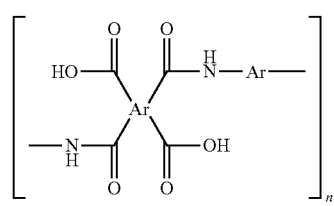

(1)

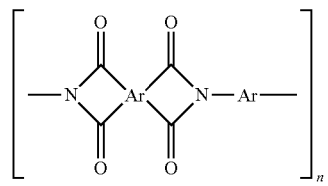

(2)

Method for Producing Polyimide Coating

The method for producing the polyimide coating according to the third aspect includes a cleaning step using the method for cleaning a polyimide-based resin film of the second aspect.

The method for producing a polyimide coating described above preferably further includes, in the following order, a coated film forming step of forming a coated film using a varnish containing a resin formed of polyamic acid and/or polyimide, fine particles, and a solvent; a prebaking step of prebaking the coated film to obtain an unbaked composite film; a first baking step of baking the unbaked composite film to obtain a polyimide-fine particle composite film; a fine particle removing step of removing fine particles from the polyimide-fine particle composite film to form a porous polyimide-based resin film 1; a polyimide-based resin removing step of removing at least a part of the porous polyimide-based resin film to obtain a porous polyimide-based resin film 2; a water-cleaning step of cleaning the porous polyimide-based resin film 2 with water; and a second baking step of baking the porous polyimide-based resin film 2 after cleaning with water.

The cleaning step is more preferably carried out after at least one step selected from the group consisting of the coated film forming step, the prebaking step, the first baking step, the fine particle removing step, the water-cleaning step, and the second baking step. Among these, it is even more preferable to perform the cleaning step after at least one step selected from the group consisting of the coated film forming step, the prebaking step, and the second baking step. The cleaning step described above is particularly preferably performed in a step before the first baking step described above in terms of improving the reduction effect of the polyimide polymer in the low molecular weight portion or the like (that is, after the coated film forming step and/or the prebaking step, more preferably after the prebaking step). In addition, as necessary, the filter medium or the filter device may be cleaned again using the polyimide-based resin film cleaning liquid according to the first aspect of the present invention after producing the filter medium or the filter device.

The polyimide-based resin film to be cleaned with the polyimide-based resin film cleaning liquid is at least one selected from the group consisting of a coated film, an unbaked composite film, a polyimide-fine particle composite film, and a porous film (porous polyimide-based resin film 1 and/or porous polyimide-based resin film 2), more preferably at least one selected from the group consisting of a coated film, an unbaked composite film, and a porous film, and even more preferably an unbaked composite film and/or a porous film.

Description will be given below of each component in the production of the polyimide-based resin film used in the method for producing the polyimide coating according to the third aspect.

Production of Varnish

A varnish which may be used in the third aspect (also referred to below as "varnish for producing a porous polyimide coating") contains a resin formed of polyamic acid and/or polyimide described above, fine particles, and a solvent. In the varnish for producing a porous polyimide coating, the content of the fine particles is preferably 65 vol % or more with respect to the total of the resin and the fine particles. In addition, the viscosity at 25° C. of the varnish for producing a porous polyimide coating is preferably 550 mPa·s or more.

When the content of the fine particles is 65 vol % or more with respect to the total of the resin and the fine particles, the porosity of the obtained porous polyimide coating is not easily lowered, and, at the time of baking of the obtained unbaked composite film, the shrinkage of the film does not easily increase and curls and wrinkles are easily suppressed.

The upper limit of the content of the fine particles is, for example, 90 vol % or less with respect to the total of the resin and the fine particles and preferably 80 vol % or less. When the upper limit of the content of the fine particles is within the above ranges, the fine particles do not easily aggregate with each other and cracks or the like do not easily occur on the surface, thus, it is possible to stably form a porous polyimide coating with good electrical characteristics.

Here, in the present specification, the vol % and the volume ratio are values at 25° C.

In addition, in the varnish for producing a porous polyimide coating, the total content of the fine particles and the resin formed of the polyamic acid and/or the polyimide is, for example, preferably 90 mass % or more with respect to the entire solid content (the total of each component other than the solvent described below) in the varnish for producing the porous polyimide coating, more preferably 95 mass % or more, and even more preferably adjusted to substantially to 99 to 100 mass % from the point of view of the stability of each producing step.

The viscosity at 25° C. of the varnish for producing a porous polyimide coating is, for example, 300 mPa·s or more. The viscosity is preferably 550 mPa·s or more, more preferably 600 mPa·s or more, and even more preferably 700 mPa·s or more. The upper limit of the viscosity is not particularly limited, but it is, for example, 5,000 mPa·s or less, and from a practical point of view, the upper limit is 3,000 mPa·s or less, preferably 2,000 mPa·s or less, and more preferably 1,500 mPa·s or less.

The viscosity is measured with an E type viscometer.

The preparation of the varnish for producing the porous polyimide coating is carried out by producing a solution including the resin formed of polyamic acid and/or polyimide described above and in which the fine particles are dispersed. More specifically, the preparation of the varnish for producing a porous polyimide coating is carried out, for example, by mixing a solvent in which fine particles are dispersed beforehand and a resin formed of polyamic acid and/or polyimide at an arbitrary ratio, or by polymerizing a resin formed of polyamic acid and/or polyimide in a solvent in which fine particles are dispersed beforehand. The fine particles described above are insoluble in the solvent used for the varnish and are able to be used without particular limitation as long as it is possible to selectively remove the fine particles after the film formation.

It is possible to produce the varnish which may be used in the third aspect by mixing a solvent in which fine particles are dispersed beforehand and a resin formed of polyamic acid and/or polyimide at an arbitrary ratio, or by polymerizing tetracarbokylic dianhydride and diamines in a solvent in which fine particles are dispersed beforehand to make a polyamic acid, or by further imidization to make a polyimide.

In a case where the fine particles and the resin formed of polyamic acid and/or polyimide are baked to form a polyimide-fine particle composite film, when the material of the fine particles is an inorganic material described below, the fine particles and the resin formed of polyamic acid and/or polyimide may be mixed such that the ratio of fine particles/polyimide is 2 to 6 (mass ratio). Setting the ratio to 3 to 5 (mass ratio) is even more preferable. In a case where the material of the fine particles is an organic material described below, the fine particles and the resin formed of polyamic acid and/or polyimide may be mixed such that the ratio of fine particles/polyimide is 1 to 3.5 (mass ratio). Setting the ratio to 1.2 to 3 (mass ratio) is even more preferable. In addition, when forming a polyimide-fine particle composite film, the fine particles and the resin formed of polyamic acid and/or polyimide may be mixed such that the volume ratio of fine particles/polyimide is 1.5 to 4.5. Setting the ratio to 1.8 to 3 (volume ratio) is even more preferable. When the mass ratio or the volume ratio of the fine particles/polyimide is set to the lower limit value or more described above when forming the polyimide-fine particle composite film, it is possible to obtain pores having an appropriate density as the separator, and if set to the upper limit value or less, it is possible to stably form a film without causing problems such as an increase in the viscosity or cracks in the film.

The polyimide may be used alone or in a combination of two or more.

Fine Particles

The material of the fine particles is not particularly limited as long as the material is insoluble in the solvent used for the varnish and is able to be removed from the polyimide coating later, and it is possible to use known materials. Examples of the inorganic material include metal oxides such as silica (silicon dioxide), titanium oxide, alumina ($Al_2O_3$) and the like and examples of the organic materials include organic polymer fine particles such as high molecular weight olefin (polypropylene, polyethylene, and the like), polystyrene, epoxy resin, cellulose, polyvinyl alcohol, polyvinyl butyral, polyester, and polyether.

Specifically, as the fine particles, for example, it is preferable to select colloidal silica, particularly monodispersed spherical silica particles, since it is possible to form uniform pores.

In addition, it is preferable that the fine particles described above have a high sphericity ratio and a small particle size distribution index. The fine particles provided with these conditions are excellent in dispersibility in the varnish and are able to be used in a state of not aggregating with each other. The average particle size of the fine particles to be used is preferably, for example, 100 to 2,000 nm. When these conditions are satisfied, since it is possible to make the pore diameters of the porous films obtained by removing the fine particles uniform, the electric field applied to the separator is able to be made uniform, which is preferable.

The fine particles may be used alone or in a combination of two or more types.

Solvent

The solvent described above is not particularly limited as long as the solvent is able to dissolve a resin formed of polyamic acid and/or polyimide and does not dissolve the fine particles and examples thereof include the solvents exemplified as solvent used in the reaction of the tetracarboxylic dianhydride and the diamine. The solvents may be used alone or in a combination of two or more types.

In the varnish for producing a porous polyimide coating, the content of the solvent is preferably 50 mass % or more with respect to the entire varnish for producing the porous polyimide coating (that is, the solid content concentration in the varnish for producing a porous polyimide coating is 50 mass % or less) in terms of coatability. The content of the solvent described above is more preferably such that the solid content concentration in the varnish for producing a porous polyimide coating is 5 to 50 massa, even more preferably 20 to 40 mass %, and yet more preferably 25 to 38 mass %.

Dispersing Agent

In the third aspect, a dispersing agent may be further added together with the fine particles for the purpose of uniformly dispersing the fine particles in the varnish. Adding a dispersing agent makes it possible to more uniformly mix the resin formed of polyamic acid and/or polyimide described above and the fine particles, and furthermore to uniformly distribute the fine particles in the formed or film-formed precursor coating. As a result, it is possible to provide dense openings on the surface of the finally obtained porous polyimide, and to enable efficient communication between the front and back surfaces, thereby improving the air permeability of the film. Furthermore, by adding the dispersing agent, the drying property of the varnish for producing a porous polyimide coating is easily improved, and the releasing property of the formed unbaked composite film from the base material and the like is easily improved.

The dispersing agent described above is not particularly limited, it is possible to use known dispersing agents. Examples thereof include anionic surfactants such as a coconut fatty acid salt, castor sulfonated oil salt, lauryl sulfate salt, polyoxyalkylene allyl phenyl ether sulfate salt, alkylbenzene sulfonic acid, alkyl benzene sulfonate, alkyl diphenyl ether disulfonate, alkyl naphthalene sulfonate, dialkyl sulfosuccinate salt, isopropyl phosphate, polyoxyethylene alkyl ether phosphate salt, and polyoxyethylene allyl phenyl ether phosphate salt; cationic surfactants such as oleyl amine acetate, lauryl pyridinium chloride, cetyl pyridinium chloride, lauryl trimethyl ammonium chloride, stearyl trimethyl ammonium chloride, behenyltrimethylammonium chloride, and didecyldimethylammonium chloride; amphoteric surfactants such as cocoalkyldimethylamine oxide, fatty acid amidopropyldimethylamine oxide, alkylpolyaminoethylglycine hydrochloride, an amidobetaine type activator, an alanine type activator, lauryl iminodipropionic acid and the like; non-ionic surfactants of polyoxyalkylene primary alkyl ethers or polyoxyalkylene secondary alkyl ethers such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, and polyoxy alkylene polystyryl phenyl ether; other polyoxyalkylene-based non-ionic surfactants such as polyoxyethylene dilaurate, polyoxyethylene laurate, polyoxyethylenated castor oil, polyoxyethylenated cured castor oil, sorbitan laurate ester, polyoxyethylene sorbitan laurate, and fatty acid diethanol amide; fatty acid alkyl esters such as octyl stearate and trimethylolpropane tridecanoate; polyether polyols such as polyoxyalkylene butyl ether, polyoxyalkylene oleyl ether, and trimethylolpropane tris(polyoxyalkylene)ether, without being limited thereto. In addition, it is also possible to use a mixture of two or more of the dispersing agents described above.

In the varnish for producing a porous polyimide coating, the content of the dispersing agent is preferably 0.01 to 5 mass % with respect to the fine particles from the viewpoint of the film forming property, more preferably 0.05 to 1 mass %, and even more preferably 0.1 to 0.5 mass %.

Description will be given below of each step which is able to be preferably performed in the method for producing the polyimide coating according to the third aspect.

Coated Film Forming Step

In the coated film forming step, a coated film is formed using a varnish for producing a porous polyimide coating. At that time, the coated film may be coated on the base material, or may be coated on a lower layer film different from the coated film.

Examples of the base material include a PET film, a SUS base material, a glass base material, and the like.

Prebaking Step

In the prebaking step, the coated film is prebaked to form an unbaked composite film.

It is possible to form the unbaked composite film, for example, by coating a varnish for producing a porous polyimide coating on a base material or the lower layer film described above and drying (prebaking) at 0 to 100° C. under normal pressure or under vacuum, preferably 10 to 100° C. under normal pressure.

Examples of the lower layer film include a lower layer unbaked composite film formed by using a varnish for a lower layer film containing a resin formed of a polyamic acid and/or polyimide, fine particles, and a solvent, in which the content of the fine particles is more than 65 vol % and 90 vol % or less with respect to the total of the resin and the fine particles (preferably 81 vol % or less). The lower layer unbaked composite film may be formed on the base material. When the content of the fine particles is more than 65 vol %, the particles are uniformly dispersed, and when the content of the fine particles is 81 vol % or less, since the particles are dispersed without aggregating, it is possible to uniformly form pores in the porous polyimide coating. In addition, when the content of the fine particles is within the range described above, in a case of forming the lower layer unbaked composite film on the base material, even if the releasing layer is not provided in advance on the base material, it is easy to ensure the releasing property after the film forming.

Here, the fine particles used for the lower layer film varnish and the fine particles used for the varnish for producing the porous polyimide coating may be the same or may be different from each other. In order to increase the density of the pores in the lower layer unbaked composite film, it is preferable that the particle size distribution index of the fine particles used for the lower layer film varnish be smaller than or equal to that of the fine particles used for the varnish for producing the porous polyimide coating. Alternatively, it is preferable that the fine particles used for the lower layer film varnish have a smaller or the same sphericity than the fine particles used for the varnish for producing the porous polyimide coating.

In addition, the fine particles used for the lower layer film varnish preferably have a smaller average particle size than the fine particles used for the varnish for producing the porous polyimide coating, in particular, the average particle size of the fine particles used for the lower layer film varnish is preferably 100 to 1,000 nm (preferably 100 to 600 nm), and the average particle size of the fine particles used for the varnish for producing a porous polyimide coating is preferably 500 to 2,000 nm (preferably 700 to 2,000 nm).

In addition, the lower layer film varnish preferably has a larger content of fine particles than the varnish for producing a porous polyimide coating. The resin formed of polyamic acid and/or polyimide, the fine particles, the solvent, and the base material are as described above. It is possible to form the lower layer unbaked composite film, for example, by coating the lower layer film varnish on a base material and drying at 0 to 100° C. at normal pressure or under vacuum, preferably at 10 to 100° C. at normal pressure.

In addition, examples of the lower layer film include lower layer films formed of a fiber material such as cellulose resin, non-woven fabric (for example, polyimide non-woven fabric, or the like, and fiber diameter is, for example, approximately 50 nm to approximately 3,000 nm), and polyimide films.

Furthermore, a baking step is performed in which the unbaked composite film or a laminated film of the unbaked composite film and the lower layer film is baked to obtain a polyimide-fine particle composite film. In a case of forming the unbaked composite film or the lower layer unbaked composite film on the base material, the baking may be carried out as is, or the unbaked composite film or the laminated film of the unbaked composite film and lower layer unbaked composite film may be released from the base material before entering the baking step.

Note that, even in a case where the lower layer film in the laminated film is a lower layer unbaked composite film formed using a lower layer film varnish and the composition of the lower layer film varnish is the same as that of the varnish for producing a porous polyimide coating which may be used in the forming of the unbaked composite film, the laminated film of the unbaked composite film and the lower layer film is substantially one layer (a single layer), but the laminated film is called a laminated film in the present specification.

In a case where the unbaked composite film or the laminated film of the unbaked composite film and the lower layer unbaked composite film is released from the base material, in order to further enhance the releasing property of the film, it is also possible to use a base material provided with a releasing layer in advance. In a case where a releasing layer is provided in advance on the base material, a releasing agent is coated on the base material and dried or fired before coating the varnish. As the releasing agent to be used, it is possible to use a known releasing agent such as alkyl phosphate ammonium salt type, fluorine type or silicone agent without particular limitation. Since the releasing agent remains slightly on the released surface of the unbaked composite film when releasing the dried unbaked composite film from the base material, it may cause discoloration during baking or have an adverse influence on the electrical characteristics, thus it is preferable to remove as much of the releasing agent as possible. It is possible to remove the releasing agent with, for example, an alcohol (also referred to below as a releasing agent removing step).

On the other hand, in a case where the base material is used as it is without providing a releasing layer for forming the unbaked composite film or the lower layer unbaked composite film, it is possible to omit the step of forming the releasing layer and the step of removing the releasing agent with the alcohols.

Immersion Step in Solvent Including Water

The method for producing the polyimide coating according to the third aspect may include an immersion step of immersing the unbaked composite film in a solvent including water.

In the production method according to the third aspect, the cleaning step may be performed after the immersion step of immersing the unbaked composite film in a solvent including water.

The production solvent used for producing the unbaked composite film usually remains in the unbaked composite film. When the unbaked composite film is baked while the production solvent remains, unevenness tends to occur in the distribution of the production solvent in the film, and as a result, curling is liable to occur in the polyimide-fine particle composite film. On the other hand, when the unbaked composite film is immersed in a solvent including water, the production solvent remaining in the unbaked composite film dissolves into the solvent including water and the amount of the production solvent remaining in the unbaked composite film is decreased. As a result, unevenness is less likely to occur in the distribution of the production solvent in the film, and curling is easily suppressed from occurring in the polyimide-fine particle composite film.

The solvent containing water is, for example, a solvent including 5 mass % or more of water. The solvent including water is preferably a solvent including water as a main component, more preferably a solvent including 50 mass % or more of water, even more preferably a solvent including 70 mass % or more of water, particularly preferably a solvent including 90 mass % or more of water, and the solvent may be 100 mass % of water. Examples of solvents other than water included in a solvent including water include water-soluble organic solvents such as nitrogen-containing polar solvents such as N-methyl-2-pyrrolidone and dimethylacetamide, and alcohol solvents such as methanol, ethanol, isopropyl alcohol, and the like. The ratio of the water-soluble organic solvent is, for example, 0 to 95 mass % with respect to the entire solvent including water, preferably 1 to 50 mass %, and more preferably 1 to 30 mass %.

The immersion time is not particularly limited, but is preferably 1 to 10 minutes, and more preferably 3 to 5 minutes. When the immersion time is within the ranges described above, the occurrence of curling in the polyimide-fine particle composite film is more easily suppressed.

The immersion temperature is not particularly limited, but is, for example, 5 to 60° C., preferably 15 to 35° C., and more preferably 23 to 30° C. When the immersion temperature is within the ranges described above, the occurrence of curling in the polyimide-fine particle composite film is more easily suppressed.

In a case of forming an unbaked composite film on the base material in the step of forming the unbaked composite film, in the immersion step, the unbaked composite film may be released from the base material and immersed in a solvent including water, or the unbaked composite film formed on the base material may be immersed in the solvent including water. Since the unbaked composite film tends to be released from the base material after the immersion step, in the immersion step, it is preferable to release the unbaked composite film from the base material and immerse the unbaked composite film in a solvent including water.

The method for producing a porous polyimide coating according to the third aspect preferably further includes a step of removing the solvent including water from the unbaked composite film after the immersion step between the immersion step described above and a baking step described below. Examples of a method for removing the solvent including water include a pressing step or a drying step described below. The removal of the solvent including water described above by the pressing step is preferable in that the occurrence of wrinkles (unevenness and undulation) is easily suppressed.

First Baking Step

The unbaked composite film is post-treated (baked) by heating to obtain a composite film (polyimide-fine particle composite film) formed of polyimide and fine particles. In a case where the unbaked composite film is formed on a lower layer film different from the unbaked composite film in the unbaked composite film forming step described above, the lower layer film is also baked together with the unbaked composite film in the baking step. The baking temperature in the baking step varies depending on the structure of the unbaked composite film and the lower layer film and the presence or absence of the condensing agent, but is preferably 120 to 375° C., and more preferably 150 to 350° C. In addition, when an organic material is used for the fine particles, it is necessary to set the temperature to a temperature lower than the thermal decomposition temperature thereof. In the baking step, it is preferable to complete the imidization.

Regarding the baking conditions, for example, it is also possible to use a method in which the temperature is raised from room temperature to 375° C. in 3 hours and then held at 375° C. for 20 minutes, or a stepwise drying and heat-imidizing method in which the temperature is raised stepwise from room temperature to 375° C. in steps of 50° C. (each step is held for 20 minutes), and finally held at 375° C. for 20 minutes. In a case of forming an unbaked composite film on a base material and temporarily releasing the unbaked composite film from the base material, it is also possible to adopt a method for fixing the end of the unbaked composite film to a mold formed of SUS or the like to prevent deformation.

it is possible to determine the film thickness of the resulting polyimide-fine particle composite film, for example, by measuring and averaging the thickness of a plurality of portions with a micrometer or the like. The preferable average film thickness depends on the application of the polyimide-fine particle composite film or the porous polyimide coating, but in a case of being used for a separator or the like, for example, the film thickness is preferably 5 to 500 μm, and more preferably 10 to 100 μm.

(Fine Particle Removing Step)

In the fine particle removing step, fine particles are removed from the polyimide-fine particle composite film to form a porous polyimide-based resin film 1.

Removing the fine particles from the polyimide-fine particle composite film by selecting an appropriate method makes it possible to produce the porous polyimide-based resin film 1 with good reproducibility.

For example, in a case where silica is used as the material of the fine particles, it is possible to dissolve and remove the silica by treating the polyimide-fine particle composite film with a low concentration hydrogen fluoride water or the like.

In addition, it is also possible to select organic materials as the material of the fine particles. it is possible to use the organic material without particular limitation as long as the organic material decomposes at a lower temperature than polyimide. Examples thereof include resin fine particles formed of a linear polymer or a known depolymerizable polymer. In normal linear polymers, the molecular chains of the polymer are randomly cut during thermal decomposition, and a depolymerizable polymer is a polymer in which the polymer decomposes into monomers upon thermal decomposition. Both disappear from the polyimide coating by decomposing into low molecular weight substances or $CO_2$. The decomposition temperature of the resin fine particles to be used is preferably 200 to 320° C., and more preferably 230 to 260° C. When the decomposition temperature is 200° C. or more, film formation is possible even when a high boiling point solvent is used for the varnish, and the selection range of baking conditions for the polyimide is widened. In addition, when the decomposition temperature is lower than 320° C., it is possible to eliminate only the resin fine particles without thermally damaging the polyimide.

Polyimide-Based Resin Removing Step

The method for producing the polyimide coating according to the third aspect preferably includes a polyimide-based resin removing step of removing at least a part of the porous polyimide-based resin film after the fine particle removing step to obtain a porous polyimide-based resin film 2. Removing at least a part of the porous polyimide-based resin film after the fine particle removing step makes it possible to improve the porosity of the porous polyimide coating of the final product in comparison with that of the porous polyimide-based resin film from which at least a part thereof is not removed.

It is possible to carry out the step of removing at least a part of the polyimide part or the step of removing at least a part of the porous polyimide-based resin film according to a typical chemical etching method, a physical removal method, or a combined method thereof.

Examples of the chemical etching method include treatment with a chemical etchant such as an inorganic alkaline solution or an organic alkaline solution. An inorganic alkaline solution is preferable. Examples of the inorganic alkaline solution include a hydrazine solution including hydrazine hydrate and ethylenediamine, a solution of an alkali metal hydroxides such as potassium hydroxide, sodium hydroxide, sodium carbonate, sodium silicate, or sodium metasilicate, an ammonia solution, an etchant with an alkali hydroxide, hydrazine, and 1,3-dimethyl-2-imidazolidinone as main components, and the like. Examples of the organic alkaline solution include alkaline solutions such as primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine.

It is possible to appropriately select pure water and alcohols for the solvents of each of the above solutions. In addition, it is also possible to use those where a surfactant is added in an appropriate amount. The alkali concentration is, for example, 0.01 to 20 mass %.

In addition, as the physical method, for example, it is possible to use a method for treating the surface of the polyimide film by dry etching such as plasma (oxygen, argon, and the like), corona discharge, or the like, dispersing a polishing agent (for example, alumina (hardness 9) or the like) in a liquid and irradiating the resultant on the surface of the aromatic polyimide film at a speed of 30 to 100 m/s, or the like.

As a physical method applicable only to the polyimide-based resin removing step performed after the fine particle removing step, it is also possible to adopt a method in which the object surface is pressure-bonded to a base film (for example, a polyester film such as a PET film) whose surface is wet with a liquid, then dried or not dried, and then the porous polyimide coating is released from the base film. The porous polyimide coating is released from the base film in a state where only the surface layer of the porous polyimide coating is left on the base film due to the surface tension or electrostatic adhesion force of the liquid.

Water-Cleaning Step

The method for producing the polyimide coating according to the third aspect preferably includes a water-cleaning step of cleaning the porous polyimide-based resin film 2 with water from the viewpoint of removing excessive etchant components or the like. Water cleaning may be performed alone, and acid cleaning may be performed in combination with water cleaning.

Second Baking Step

From the viewpoint of improving the wettability of the surface of the porous polyimide-based resin film 2 to the organic solvent and removing the remaining organic matter, the method for producing the polyimide coating according to the third aspect preferably includes a second baking step of baking the porous polyimide-based resin film 2 described above after the water-cleaning. The baking conditions in the second baking step are the same as the baking conditions in the first baking step and may be set appropriately.

The overall film thickness of the porous polyimide coating produced by the production method according to the third aspect is not particularly limited, but is preferably 5 μm or more and 500 μm or less, more preferably 10 μm or more and 100 μm or less, and particularly preferably 10 μm or more and 30 μm or less. It is possible to obtain the film thickness by measuring and averaging the thicknesses of a plurality of portions with a micrometer or the like in the same manner as the measurement of the polyimide-fine particle composite film.

It is possible to obtain the porous polyimide coating, for example, as a porous polyimide coating having an average pore diameter of 100 to 5,000 nm, and the average pore diameter is preferably 200 to 3,000 nm, and more preferably 300 to 900 nm. In the present specification, when the chemical etching treatment is performed, the average pore diameter is a value obtained by obtaining the average change in size of the communication pores by a porometer and obtaining the actual average pore diameter from this value; however, when the chemical etching treatment is not performed, it is possible to set the average particle size of the fine particles used for producing the porous polyimide coating as the average pore diameter.

It is possible to obtain the porous polyimide coating as a porous polyimide coating having a porosity of, for example, 50 to 90 mass %, and preferably 55 to 80 mass %, which is determined by a method described below.

The thickness of the layer formed from the varnish for producing a porous polyimide coating is preferably 4.3 μm or more and 500 μm or less, more preferably 4.5 μm or more and 99.7 μm or less, and even more preferably 5 μm or more and 29.7 μm or less. In the prebaking step, in a case of forming the unbaked composite film on a lower layer film different from the unbaked composite film, the thickness of the layer formed from the lower layer film is preferably 0.3 μm or more and 5 μm or less, more preferably 0.4 μm or more and 4 μm or less, and even more preferably 0.5 μm or more and 3 μm or less. It is possible to calculate the thickness of each layer by observing and averaging a plurality of sites of the cross-section of the porous polyimide coating with a scanning electron microscope (SEM) or the like.

Filter, Method for Producing Filter Medium or Filter Device Provided with this Filter The method for producing a filter including a polyimide coating according to the fourth aspect is a method in which the polyimide coating is produced according to the method for producing the polyimide coating according to the third aspect.

It is possible to use the produced filter as a gas or liquid separation film.

A method for producing a filter medium provided with a filter including a polyimide coating according to the fifth aspect is a method in which the polyimide coating is produced according to the method for producing the polyimide coating according to the third aspect.

It is possible to use the produced filter medium as a filter medium for metal filters or the like used, for example, in the field of semiconductor production, and, in addition, it is also possible to use the produced filter medium as a laminate including the filter medium and a filter material, or as a filter device.

A method for producing a filter device provided with a filter including a polyimide coating according to a sixth aspect is a method in which the polyimide coating is produced by a method for producing a polyimide coating according to the third aspect.

The filter device to be produced is not particularly limited, but in the filter device, the polyimide coating is arranged such that the feed solution and the filtrate intersect. In relation to the liquid flow path, the polyimide coating may be arranged in parallel to the flow path or may be arranged to intersect the flow path. The regions before and after passing the polyimide coating are appropriately sealed such that the feed solution is separated from the filtrate. For example, as a sealing method, a polyimide coating may be processed by adhesion using light (UV) curing, adhesion by heat (including adhesion (thermal welding or the like) using the anchor effect), adhesion using an adhesive, or the like, or it is possible to use the polyimide coating and a filter material (filter) by adhesion using, for example, an assembling method or the like, and it is possible to further use these polyimide coatings by providing an outside container formed of a thermoplastic resin such as polyethylene, polypropylene, tetrafluoroethylene•perfluoroalkyl vinyl ether copolymer (PFA), polyether sulfone (PES), polyimide, or polyamideimide.

In the production method according to the fourth to sixth aspects, the polyimide-based resin film cleaning liquid according to the first aspect is used as a polyimide-based resin film cleaning liquid for producing a filter, for producing a filter medium, or for producing a filter device.

Method for Producing Chemical Solution for Lithography

A method for producing a chemical solution for lithography according to a seventh aspect of the present invention includes passing the chemical solution for lithography for treatment through the filter device after passing the polyimide-based resin film cleaning liquid of the first aspect through a filter device provided with a filter including a polyimide coating.

As a method for passing the polyimide-based resin film cleaning liquid of the first aspect through the filter device, all of the micropores present in the filter may or may not be completely filled with the polyimide-based resin film cleaning liquid of the first aspect. Furthermore, the polyimide-based resin film cleaning liquid of the first aspect may be passed through in a state of being kept under reduced pressure.

Examples of the chemical solution for lithography for treatment include chemical solutions used in steps of producing a semiconductor device, for instance, a chemical solution for forming a protective film for modifying a substrate, a chemical solution such as a cleaning liquid for a silicon wafer, a chemical solution containing a photosensitive material such as a resist composition, a raw material chemical solution of a photosensitive material such as a resin solution, a developing solution for patterning a chemically amplified resist film, a rinsing solution (among these, an organic developing solution containing an organic solvent or an organic rinsing solution), or the like. Here, in a case where the same chemical solution as the polyimide-based resin film cleaning liquid of the first aspect is used as the chemical solution for lithography, the cleaning operation and the production of the chemical solution for lithography may be performed consecutively, or intermittently, but the portion used as a cleaning liquid is preferably not included in the chemical solution for lithography.

According to the method for producing a chemical solution for lithography according to the seventh aspect of the present invention, it is possible to produce a chemical solution for lithography in which the occurrence of coating defects and pattern defects is reduced. For example, in a pattern forming method which includes (P1) a step of forming a film with a chemically amplified resist composition, (P2) a step of exposing the film, and (P3) a step of developing the exposed film using an organic developing solution, and, optionally, (P4) a step of rinsing using an organic rinsing solution, when the chemical solution for lithography according to the production method according to the seventh aspect of the present invention is used as the organic developing solution and/or the organic rinsing liquid, it is considered that it is possible to suppress the generation of particles which are likely to be problematic when forming a fine pattern.

EXAMPLES

More detailed description will be given below of the present invention with reference to examples, but the scope of the present invention is not limited to these examples.

Reference Example

Formation of Porous Polyimide Film

The tetracarboxylic dianhydride, diamine, polyamic acid, organic solvent, dispersing agent, and fine particles shown below were used. The particle size distribution index of silica (1) is approximately 3.3, and the particle size distribution index of silica (2) is approximately 1.5.

Tetracarboxylic dianhydride: pyromellitic acid dianhydride

Diamine: 4,4'-diaminodiphenyl ether

Polyamic acid solution: reaction product of pyromellitic dianhydride and 4,4'-diaminodiphenyl ether (solid content: 21.9 mass % (organic solvent: N,N-dimethylacetamide))

Organic solvent (1): N,N-dimethylacetamide (DMAc)

Organic solvent (2): γ-butyrolactone

Dispersing agent: polyoxyethylene secondary alkyl ether-based dispersing agent

Fine particles:

Silica (1): silica having an average particle size of 700 nm

Silica (2): silica having an average particle size of 300 nm

Etchant solution (1): mixed solution of methanol and water having a mass ratio of 3:7 containing 1.1 mass % of NaOH Preparation of Silica Dispersion 23.1 parts by mass of silica (1) or silica (2) were added to a mixture of 23.1 parts by mass of the organic solvent (1) and 0.1 parts by mass of the dispersing agent, and stirred to prepare a silica dispersion.

Preparation of Varnish 42.0 parts by mass of the silica dispersion obtained in the preparation of the silica dispersion were added to 41.1 parts by mass of the polyamic acid solution, and the organic solvents (1) and (2) were respectively added thereto such that the ratio of organic solvent (1)/organic solvent (2) in the solvent composition of the entire varnish was 90/10, following by stirring, to prepare a varnish. Here, in the obtained varnish, the volume ratio between the polyamic acid and silica is 40:60 (with the mass ratio being 30:70).

Forming of Unbaked Composite Film

The varnish described above was formed on a PET film as a base material using an applicator. The resultant was prebaked at 90° C. for 5 minutes to produce an unbaked composite film having a film thickness of 40 μm. After immersion in water for 3 minutes, the unbaked composite film, as well as the base material, was pressed while the unbaked composite film was passed between the two rollers. At that time, the pressure applied to the rolls was 3.0 kg/cm², the roll temperature was 80° C., and the moving speed of the unbaked composite film was 0.5 m/min. The unbaked composite film was released from the base material to obtain an unbaked composite film.

Imidization of Unbaked Composite Film

The unbaked composite film was imidized by a heat treatment (baking) at 340° C. for 15 minutes to obtain a polyimide-fine particle composite film.

Formation of Polyimide Porous Film

The polyimide-fine particle composite film obtained above was immersed in a 10% HF solution for 10 minutes to remove fine particles contained in the film, and then cleaned with water and dried to obtain a polyimide porous film.

Chemical Etching

As a polyimide-based resin removing step, the polyimide porous film was immersed in the chemical etchant (1) for 2 minutes and subjected to a polyimide-based resin removing step to obtain a porous polyimide film. Thereafter, re-baking was performed at 340° C. for 15 minutes.

Example 1

The obtained porous polyimide film (300 cm²) having a thickness of 40 μm was cleaned three times with 800 g of a mixed solvent containing dimethylacetamide and n-butyl acetate in a mass ratio of 7:3 and then washed off with the mixed solvent, and after substituting the solvent with methanol for semiconductors, vacuum drying was carried out for one day and night.

In order to evaluate the cleanness of the obtained film, the following evaluation was carried out using n-butyl acetate as a filtration target liquid. During the evaluation, a test example in which the film was immersed in order to acquire a sample without performing filtration (passing through the obtained film) was used as a comparative control (referred to as Comparative Example 1) to facilitate weight comparison with the non-volatile content in Comparative Example 1. The same applies to Examples 2 to 10 below.

After immersing the obtained film in 800 g of n-butyl acetate for 1 day, the film was taken out and the obtained n-butyl acetate solution was concentrated to 5 mL. The obtained solution was transferred onto an aluminum pan, whose mass was measured in advance, and heated on a hot plate at 150° C. until n-butyl acetate was completely evaporated. After the n-butyl acetate completely evaporated, the mass of the aluminum pan was measured and the amount of the eluate was quantified as 0.26 mg from the difference in mass.

Example 2

The eluate was quantitatively determined in the same manner as in Example 1 except that 800 g of a mixed solvent of dimethylacetamide and 2-heptanone in a mass ratio of 6:4 was used, and the amount of the eluate was 0.46 mg.

Example 3

The eluate was quantitatively determined in the same manner as in Example 1 except that 800 g of a mixed solvent of dimethylacetamide, cyclohexanone and propylene glycol monomethyl ether in a mass ratio of 6:2:2 was used, and the amount of the eluate was 0.55 mg.

Example 4

The eluate was quantitatively determined in the same manner as in Example 1 except that 800 g of a mixed solvent of dimethylacetamide and propylene glycol monomethyl ether in a mass ratio of 3:7 was used, and the amount of the eluate was 0.76 mg.

Example 5

The eluate was quantitatively determined in the same manner as in Example 1 except that 800 g of a mixed solvent of dimethylacetamide and n-butyl acetate in a mass ratio of 3:7 was used, and the amount of the eluate was 0.56 mg.

Example 6

The eluate was quantitatively determined in the same manner as in Example 1 except that 800 g of dimethylacetamide was used, and the amount of the eluate was 0.51 mg.

Example 7

The eluate was quantitatively determined in the same manner as in Example 1 except that 80.0 g of dimethylformamide was used, and the amount of the eluate was 0.48 mg.

Example 8

The eluate was quantitatively determined in the same manner as in Example 1 except that 800 g of a mixed solvent of dimethylformamide and ethyl lactate in a mass ratio of 7:3 was used, and the amount of the eluate was 0.57 mg.

Example 9

The eluate was quantitatively determined in the same manner as in Example 1 except that 800 g of a mixed solvent of N-methylpyrrolidone and cyclohexanone in a mass ratio of 8:3 was used, and the amount of the eluate was 0.73 mg.

Example 10

The eluate was quantitatively determined in the same manner as in Example 1 except that 800 g of 2-heptanone was used, and the amount of the eluate was 0.62 mg.

Comparative Example 1

After immersing the porous polyimide film (300 cm$^2$) having a thickness of 40 μm in 800 g of n-butyl acetate for 1 day, the film was taken out, and the eluate was quantitatively determined in the same manner as in Example 1. The amount of the eluate was 1.50 mg.

When the aluminum pan was measured by a total reflection measurement method (ATR) of a Fourier transform infrared spectrophotometer (FT-IR) (Nicolet 6700, manufactured by Thermo Fisher Scientific), a peak derived from the carbonyl group of polyimide (including amic acid) of 1728 cm$^{-1}$ is detected and it is inferred that the eluate is a low molecular weight portion of the polymer of polyimide.

The results of Examples 1 to 10 and Comparative Example 1 are summarized in Table 1.

TABLE 1

|  | Cleaning liquid (mass ratio) | Eluate (mg/300 cm$^2$) |
| --- | --- | --- |
| Example 1 | Dimethylacetamide:n-butyl acetate (7:3) | 0.26 |
| Example 2 | Dimethylacetamide:2-heptanone (6:4) | 0.46 |
| Example 3 | Dimethylacetamide:cyclohexanone:propylene glycol monomethyl ether (6:2:2) | 0.55 |
| Example 4 | Dimethylacetamide:propylene glycol monomethyl ether (3:7) | 0.76 |
| Example 5 | Dimethylacetamide:n-butyl acetate (3:7) | 0.56 |
| Example 6 | Dimethylacetamide | 0.51 |
| Example 7 | Dimethylformamide | 0.48 |
| Example 8 | Dimethylformamide:ethyl lactate (7:3) | 0.57 |
| Example 9 | N-methylpyrrolidone:cyclohexanone (8:3) | 0.73 |
| Example 10 | 2-heptanone | 0.62 |
| Comparative Example 1 | — | 1.50 |

As is clear from the results shown in Table 1, it is understood that the amount of the eluate was reduced in Examples 1 to 10 using the cleaning liquid of the present invention, as compared with Comparative Example 1 in which the cleaning liquid of the present invention was not used.

In addition, it is understood that the cleaning agent of Examples 1 and 2, which is a mixed solvent of an aprotic polar solvent (A) and an aliphatic carboxylic acid ester or a chain or cyclic ketone, has excellent eluate reduction.

Film Cleaning Evaluation and Filtration Evaluation in Filter Device

For the wafer surface defect evaluation, a surface defect observation device (product name: KLA 2371, manufactured by KLA Tencor Corporation.) was used.

Filter Device

A filter device was prepared which was provided with a porous polyimide coating having a film thickness of 40 μm, a porosity of approximately 70 mass %, and an average pore diameter of 300 nm, which can be obtained by the same production method as the formation of the above porous polyimide film.

The porosity (mass %) was defined as the mass of the silica fine particles with respect to the total mass of the polyimide resin and the silica fine particles used in the production of the porous polyimide film.

Below, regarding the polyimide porous film in the filter device, the polyimide porous film before being cleaned with the polyimide-based resin film cleaning liquid according to the present invention is referred to as PI porous film A.

A filter device (Dispo, manufactured by Pall Corporation) was prepared which was provided with a porous film (pore diameter: approximately 20 nm) formed of polyamide (nylon) having a film thickness of 70 μm.

Example 11

A cleaning treatment was carried out by passing 12 L of cyclohexanone as a cleaning liquid through the filter device provided with the PI porous film A under conditions of a filtration pressure of 1.0 kgf/cm$^2$ (9.8 N/cm$^2$) at room temperature. The last 100 ml which was passed therethrough was collected as a sample, coated on a wafer, a prebaking (PAB) treatment was carried out on a hot plate at 110° C. for 60 seconds, and defects on the wafer surface were evaluated.

Here, a test example in which liquid other than the last approximately 100 ml of the liquid for sample acquisition was not passed (that is, only approximately 100 ml was passed) was used as a comparative control (referred to as Comparative Example 2). The same also applies below to Comparative Examples 3 and 4 and Examples 12 and 13.

Comparative Example 2

Using a filter device provided with a PI porous film A, approximately 100 ml of cyclohexanone was passed therethrough under conditions of a filtration pressure of 1.0 kgf/cm$^2$ (9.8 N/cm$^2$) at room temperature. Approximately 100 ml of the sample after passing through the filter device was coated on the wafer and a prebaking (PAB) treatment was performed under conditions of a hotplate at 110° C. for 60 seconds to evaluate defects on the wafer surface.

Comparative Example 3

The wafer surface defects were evaluated in the same manner as in Comparative Example 2 except that a filter device provided with a porous film (pore diameter: approximately 20 nm) formed of polyamide (nylon) was used.

Comparative Example 4

The wafer surface defects were evaluated in the same manner as in Example 11 except that a filter device provided with a porous film (pore diameter: approximately 20 nm) formed of polyamide (nylon) was used.

Example 12

A cleaning treatment was performed on the filter device provided with the PI porous film A by passing 10 L of liquid therethrough under the conditions of a filtration pressure of 1.0 kgf/cm$^2$ (9.8 N/cm$^2$) and room temperature in a state where the filter device was filled with cyclohexanone as a cleaning liquid for 3 days. The last 100 ml which was passed therethrough was collected as a sample, a wafer was coated therewith, a prebaking (PAB) treatment was carried out on a hot plate at 110° C. for 60 seconds, and defects on the wafer surface were evaluated.

Example 13

The evaluation of defects on the wafer surface was carried out in the same manner as in Example 12 except that n-butyl acetate was used as the cleaning liquid.

The results of the defect evaluation of the wafer surface are described in Table 2. The numerical value of the defects is a relative numerical value with the numerical value of Comparative Example 3 taken as 100.

TABLE 2

|  | Cleaning liquid | Porous film | Defects |
| --- | --- | --- | --- |
| Comparative Example 2 | None | Polyamide | 100 |
| Comparative Example 3 | None | Polyamide | 100 |
| Example 11 | Cyclohexanone | Polyimide | 0.6 |

TABLE 2-continued

|  | Cleaning liquid | Porous film | Defects |
| --- | --- | --- | --- |
| Comparative Example 4 | Cyclohexanone | Polyamide | 23 |
| Example 12 | Cyclohexanone | Polyimide | 1 |
| Example 13 | n-butyl acetate | Polyimide | 2 |

As is clear from the results shown in Table 2, it was confirmed that the polyimide-based resin film cleaning liquid according to the present invention is also effective for cleaning the filter device provided with the polyimide porous film. Since the filter device after cleaning is also suitable for purification of cyclohexanone which is a ketone solvent and n-butyl acetate which is an ester solvent, in a case where these purified solvents are used as an organic developing solution for patterning a chemically amplified resist film or an organic rinse solution, it is considered that it is possible to suppress the generation of particles which are likely to be problematic in forming a fine pattern.

Examples 14 to 15 and Comparative Example 5

100 parts by mass of a copolymer (mass average molecular weight: 7,000) formed of 50 mol % of p-hydroxybenzylsilsesquioxane unit, 22 mol % of p-methoxybenzylsilsesquioxane unit, and 28 mol % of phenylsilsesquioxane unit, 3 parts by mass of bis(4-tert-butylphenyl)iodonium camphorsulfonate and 5 parts by mass of 1,3,4,6-tetrakis (n-butoxymethyl)glycoluril were dissolved in 300 parts by mass of propylene glycol monomethyl ether monoacetate to prepare a composition for forming an antireflection film. The composition was passed through the filter devices (Examples 14 to 15) after cleaning treatment of Examples 12 to 13 and the filter device (Comparative Example 5) provided with a porous film made of polyethylene (pore diameter: approximately 20 nm), respectively. Once passed, each composition was coated on a silicon wafer and subjected to a heat treatment in two stages under conditions of 100° C. for 90 seconds and subsequently at 230° C. for 90 seconds to form an antireflection film having a thickness of approximately 70 nm, and the surface defects were observed. As a result, the number of defects in Examples 14 to 15 was reduced in comparison with Comparative Example 5.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A method for producing a polyimide coating, the method comprising in the following order:
   forming a coated film by using a varnish comprising fine particles, a solvent, and a resin comprising polyamic acid and/or polyimide
   prebaking the coated film to obtain an unbaked composite film;
   firstly-baking the unbaked composite film to obtain a polyimide-fine particle composite film;
   removing fine particles from the polyimide-fine particle composite film to form a porous polyimide-based resin film 1;

removing at least a part of the porous polyimide-based resin film 1 to obtain a porous polyimide-based resin film 2;

cleaning the porous polyimide-based resin film 2 with water; and secondary-baking the porous polyimide-based resin film 2 after the water cleaning;

wherein the method for producing a polyimide coating further comprises washing the polyimide-based resin film by bringing a polyimide-based resin film cleaning liquid into contact with the polyimide-based resin film comprising the resin comprising polyamic acid and/or polyimide;

wherein the cleaning is carried out after at least one selected from the group consisting of the forming coated film, the prebaking, the firstly-baking, the removing fine particle, the water-cleaning, and the secondary-baking; and wherein the polyimide-based resin film cleaning liquid comprises at least one solvent selected from the group consisting of a hydroxy aliphatic carboxylic acid ester, an aliphatic carboxylic acid ester, a chain or cyclic ketone, an alkylene glycol monoalkyl ether, and an alkylene glycol monoalkyl ether acetate, as well as an aprotic polar solvent other than these solvents.

2. A method for producing a filter comprising a polyimide coating,
   wherein the polyimide coating is produced by the method according to claim 1.

3. A method for producing a filter medium provided with a filter comprising a polyimide coating,
   wherein the polyimide coating is produced by the method according to claim 1.

4. A method for producing a filter device provided with a filter comprising a polyimide coating,
   wherein the polyimide coating is produced by the method according to claim 1.

5. A method for producing a chemical solution for lithography, the method comprising:
   passing a polyimide-based resin film cleaning liquid comprising at least one solvent selected from the group consisting of a hydroxy aliphatic carboxylic acid ester, an aliphatic carboxylic acid ester, a chain or cyclic ketone, an alkylene glycol monoalkyl ether, an alkylene glycol monoalkyl ether acetate, and an aprotic polar solvent other than these solvents, through a filter device provided with a filter comprising a polyimide coating, and then allowing a chemical solution for lithography for treatment to pass through the filter device,
   wherein the polymide coating is produced by the method according to claim 1.

6. The method according to claim 1, wherein the polyimide-based resin film is comprised in a filter device.

7. The method according to claim 1, wherein the polyimide-based resin film cleaning liquid comprises:
   (A) an aprotic polar solvent other than the following solvent (B), and
   (B) at least one solvent selected from the group consisting of a hydroxy aliphatic carboxylic acid ester, an aliphatic carboxylic acid ester, a chain or cyclic ketone, an alkylene glycol monoalkyl ether, and an alkylene glycol monoalkyl ether acetate.

8. The method according to claim 7, wherein the solvent (B) is a compound having 5 to 7 carbon atoms.

9. The method according to claim 8, wherein the solvent (B) is at least one solvent selected from the group consisting of ethyl lactate, butyl acetate, 2-heptanone, cyclohexanone, propylene glycol monomethyl ether and propylene glycol monomethyl ether acetate.

10. The method according to claim 1, wherein the aprotic polar solvent is at least one selected from the group consisting of a solvent having an amide structure represented by the following general formula (s) and an alkylsulfinyl alkane:

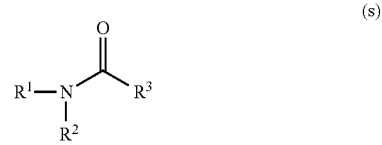

(s)

wherein $R^1$ and $R^2$, which may be the same or different, each represents a hydrogen atom or an alkyl group; $R^3$ represents a hydrogen atom, an alkyl group, or a group represented by —$NR^4R^5$ where $R^4$ and $R^5$, which may be the same or different, represent a hydrogen atom or an alkyl group; and $R^2$ and $R^3$ may be combined with each other to form a ring.

11. The method according to claim 10, wherein the aprotic polar solvent is at least one selected from the group consisting of dimethylformamide, dimethylacetamide, N-methylpyrrolidone, 1,1,3,3-tetramethylurea, and dimethylsulfoxide.

12. The method according to claim 1, wherein the polyimide-based resin film is an unbaked composite film and/or a porous film.

* * * * *